(12) United States Patent
Wu

(10) Patent No.: US 7,301,531 B2
(45) Date of Patent: Nov. 27, 2007

(54) OPTICAL MOUSE HAVING IMAGE LIGHTS SOURCE WITH DIFFERENT COLORS

(75) Inventor: Yung Fu Wu, Chungho (TW)

(73) Assignee: Lite-On Technology Corporation, Taipei (TW)

( * ) Notice: Subject to any disclaimer, the term of this patent is extended or adjusted under 35 U.S.C. 154(b) by 664 days.

(21) Appl. No.: 10/814,147

(22) Filed: Apr. 1, 2004

(65) Prior Publication Data

US 2005/0219215 A1 Oct. 6, 2005

(51) Int. Cl.
    *G09G 5/08* (2006.01)
(52) U.S. Cl. ..................................... 345/163
(58) Field of Classification Search ................ 345/163, 345/169, 166, 164–165, 158; 250/221; 341/31
    See application file for complete search history.

(56) References Cited

U.S. PATENT DOCUMENTS 6,111,563 A * 8/2000 Hines .......................... 345/166
6,424,337 B1 * 7/2002 Eriksson et al. ............ 345/163
6,697,053 B2 * 2/2004 Kajihara ...................... 345/166
6,819,314 B2 * 11/2004 Black .......................... 345/166

* cited by examiner

*Primary Examiner*—Richard Hjerpe
*Assistant Examiner*—Abbas Abdulselam
(74) *Attorney, Agent, or Firm*—Rosenberg, Klein & Lee

(57) ABSTRACT

An optical mouse has a housing, a printed circuit board, a light source unit, a photodetector unit, a light-guiding unit and a lens unit. The light source unit has different colors of image light sources and is disposed on the printed circuit board. The light-guiding unit is arranged in the housing and adjacent to the light source unit for guiding a non-complementary color light relative to a reflection surface from one of the image light sources to the reflection surface. The lens unit is arranged in the housing and positioned below the photodetector unit for converging a reflected light reflected by the reflection surface into the photodetector unit. Furthermore, the optical mouse can be operated on various colors of reflection surfaces, and still retains better sensitivity.

16 Claims, 4 Drawing Sheets ic OPTICAL MOUSE HAVING IMAGE LIGHTS SOURCE WITH DIFFERENT COLORS

BACKGROUND OF THE INVENTION

1. Field of the Invention

The present invention relates to an optical mouse and, more particularly to an optical mouse having image light sources with different colors.

2. Description of the Related Art

In general, an optical mouse is designed to detect movement of an image carried by a light reflected from a mouse pad (or a reflection surface) on which the optical mouse is moved, thereby causing a cursor on an associated display screen, to be moved in accordance with the movement of the mouse. Since such an optical mouse has advantages of the accuracy of its motion detection, and smoothness in its motion, as compared with the prior art ball-type mouse, its use is gradually increasing.

FIG. 1 is an illustration of a typical optical mouse. Such an optical mouse includes a printed circuit board 10a, a red Light Emitting Diode (LED) 20a disposed on the printed circuit board 10a for emitting red light, a photodetector unit 30a for detecting the image formed on the mouse pad (or the reflection surface) due to the red light emitted thereto, and an optical element 40a having a light-guiding unit 41a and a lens unit 42a. The light-guiding unit 41a can guide the red light emitted from the red LED 20a for irradiating the reflection surface with a bright light. The lens unit 42a can converge a reflected light reflected by the reflection surface into a photodetector unit 30a. The image detected at the optical sensor 30a is input into the printed circuit board 10a through lead frames where it is converted to an electrical signal, thus enabling the cursor to be moved on the display screen by movement of the mouse.

However, the conventional optical mouse still has disadvantages as follows. When the optical mouse is designed to provide only one red light source carrying the red image on the green reflection surface, the light-reflection rate of the red image will be lower relative to the green reflection surface because red is the complementary color for green. Therefore, the red image is greatly absorbed by the green reflection surface, causing the detected quantity of the red light to be lower, so as to produce a "color blindness" phenomenon. As described above, the sensitivity of the optical mouse will be greatly reduced to point of being nonfunctional. In order to eliminate the aforesaid disadvantages, a high sensitivity photodetector unit is provided, or a high power red LED, but this increases component costs and makes manufacturing difficult.

SUMMARY OF THE INVENTION

It is therefore a principal object of the invention to provide an optical mouse having image light sources with different colors, which optical mouse can choose one of the image light sources with different colors to eliminate the complementary color problem between the image light and the reflection surface, so that the optical mouse can operate on any color of reflection surface, and still can retain the better sensitivity.

In order to accomplish the above object, the present invention provides an optical mouse including a housing, a printed circuit board, a light source unit, a photodetector unit, a light-guiding unit and a lens unit. The housing has an accommodation space formed therein. The printed circuit board is arranged in the accommodation space of the housing. The light source unit has different colors of image light sources and is disposed on the printed circuit board. The photodetector unit is disposed on the printed circuit board and opposite the light sources. The light-guiding unit is arranged in the accommodation space of the housing and adjacent to the light source unit for guiding a non-complementary color light relative to a reflection surface from one of the image light sources to the reflection surface. The lens unit is arranged in the accommodation space of the housing and positioned below the photodetector unit for converging a reflected light reflected by the reflection surface into the photodetector unit.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
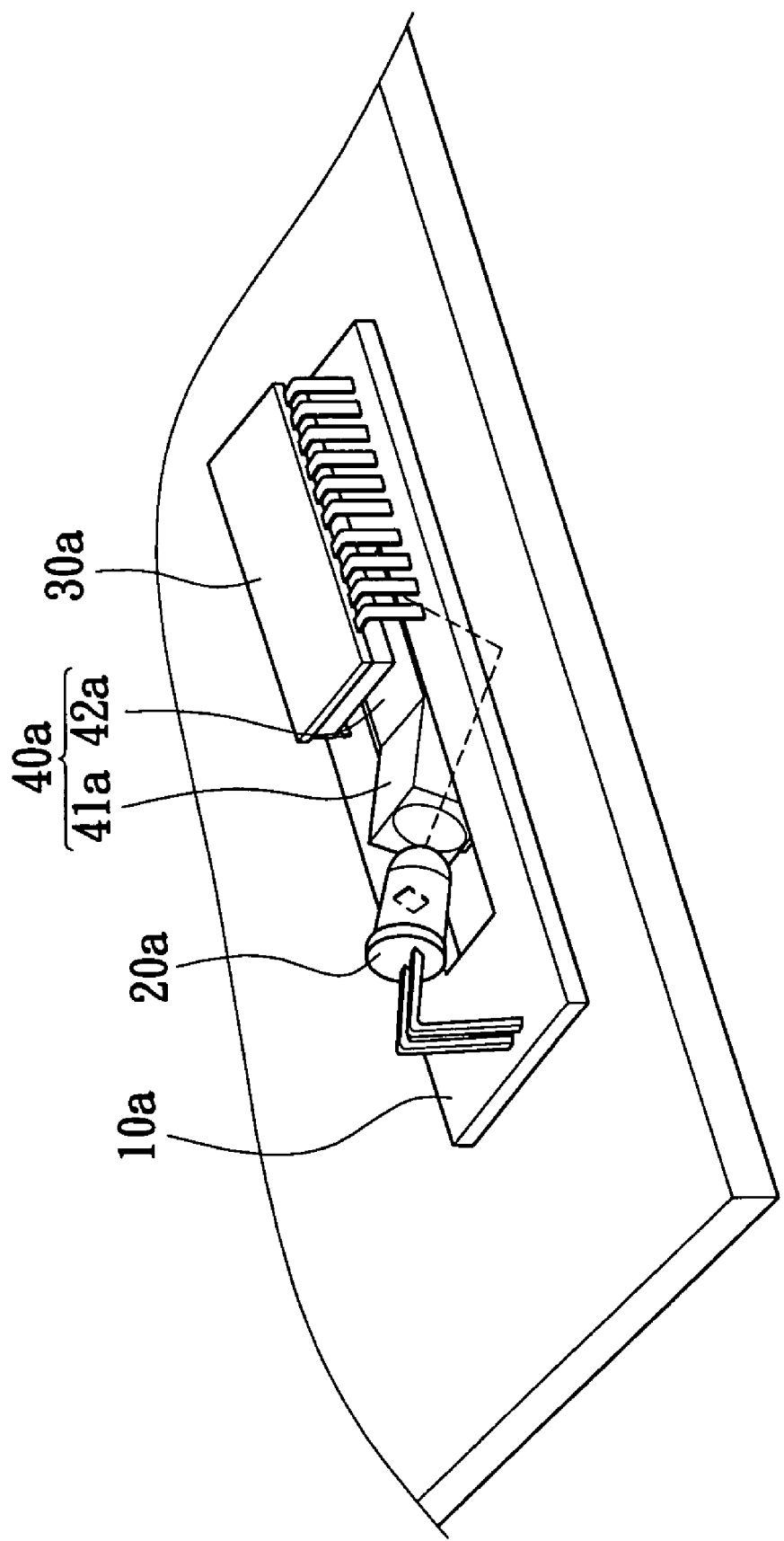
FIG. 1 is a perspective view of an optical mouse according to prior art.

Wherever possible in the following description, like reference numerals will refer to like elements and parts unless otherwise illustrated.

Figure 2:
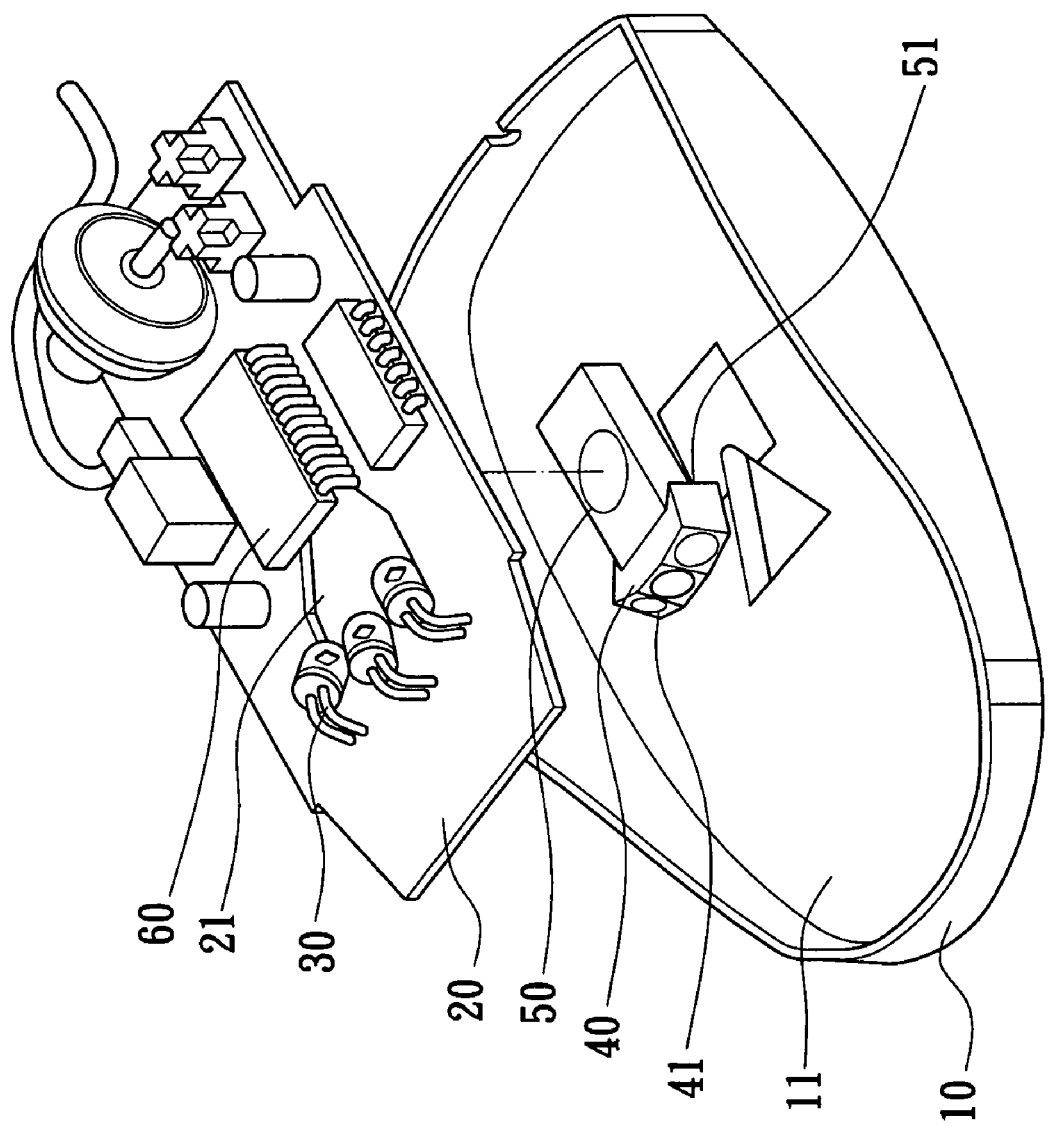
FIG. 2 is a perspective exploded view of an optical mouse of the present invention.
Figure 3:
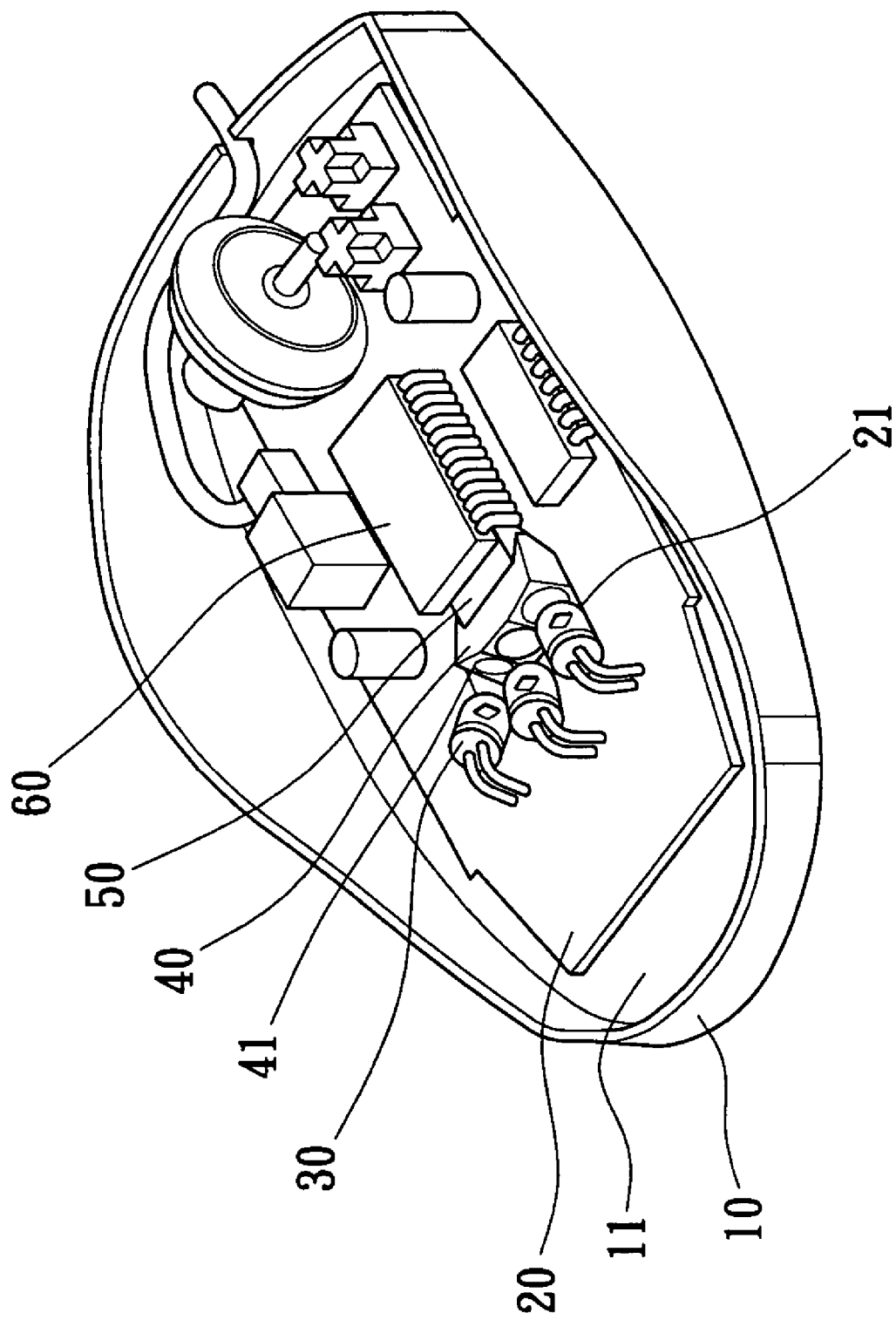
FIG. 3 is a perspective view of the optical mouse having image light sources with different colors according to the present invention.
Figure 4:
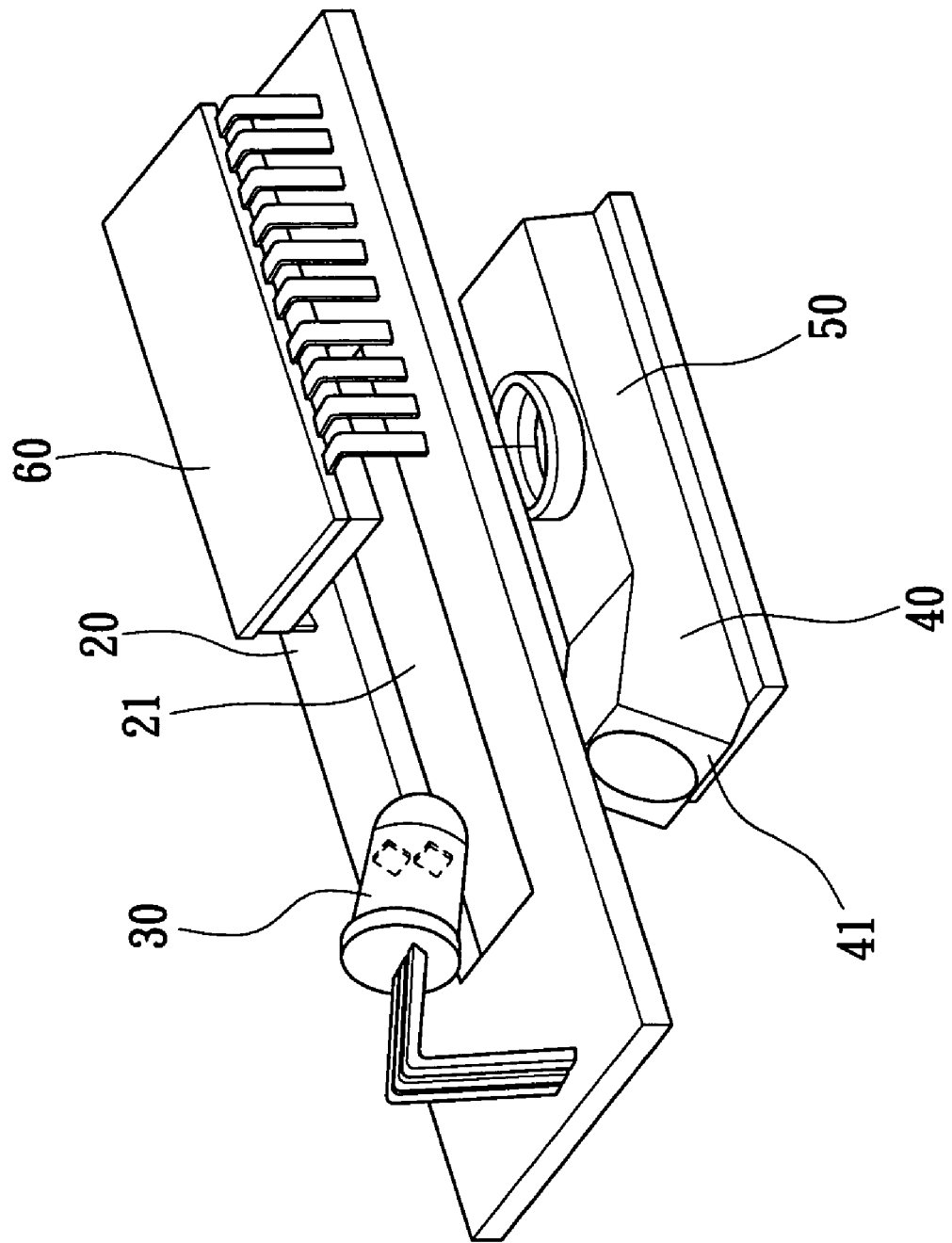
FIG. 4 is a perspective view of the optical mouse having a LED with two different colors of light chips according to the present invention.

With reference to FIGS. 2 to 4, the present invention provides an optical mouse having image light sources with different colors, including a housing 10, a printed circuit board 20, a light source unit 30, a light-guiding unit 40, a lens unit 50, a photodetector unit 60. The light source unit 30 and the photodetector unit 60 are disposed on the printed circuit board 20 arranged in an accommodation space 11 formed inside the housing 10. The light-guiding unit 40 can conduct a non-complementary color light relative to a work pad (or a reflection surface) from one of the light sources to the work pad. Therefore, it is required to arbitrarily choose and change as one of the image light sources of the light source unit 30 to avoid the image light and the reflection surface being complementary colors. The light-reflection rate is thus improved, and a "color blindness" phenomenon of the optical mouse is avoided.

The printed circuit board 20 has a light hole 21 for allowing the reflected light converged by the lens unit 50 to pass therethrough. The light source unit 30 and the photodetector unit 60 are arranged on two opposite sides of the light hole 21 on the printed circuit board 20. The light source unit 30 has different colors of image light sources disposed on the printed circuit board 20.

The light-guiding unit 40 is inclinedly arranged in the accommodation space 11 of the housing 10, and has a portion upwardly extended through the light hole 21 of the printed circuit board 20 to face the light source unit 30. The light-guiding unit 40 has a plurality of light receiving surfaces 41 non-coplanarly connected to one another and in correspondence with the image light sources for mating different colors of incident lights emitted from the image light sources of the light source unit 30, respectively. The area of the light-receiving surface 41 of the light-guiding unit 40 is larger than that of a light-exiting surface opposite the light receiving surfaces 41 for enabling the light to carry a brightest image formed on the reflection surface.

Consequently, the light emitted from one of the image light sources is received by one of the light receiving surfaces 41 of the light-guiding unit 40, and then from the light-exiting surface to project on the reflection surface, thereby guiding the projecting light to be in the brightest image according to the detecting region of the photodetector unit 60.

The lens unit 50 is upwardly extended through the light hole 21 of the printed circuit board 20 to face the photodetector unit 60. The lens unit 50 has a coupling portion 51 for coupling with an end of the light guiding unit 40. When the optical mouse is used, it can be required to choose or change as one of the image light sources for providing a non-complementary color light relative to the reflection surface. In operation, the non-complementary color light is emitted from one of the image light sources through the light-guiding unit 40 for guiding to the reflection surface. The lens unit 50 is utilized to converge the reflected light reflected by the reflection surface into the photodetector unit 60, thereby causing a cursor on an associated display screen to be moved in accordance with the movement of the optical mouse.

With the arrangement of the optical mouse according to the present invention, the light source unit 30 includes a red LED, a green LED and a blue LED. When the optical mouse is operated on, for example, a green reflection surface, it is required to choose or change to a green light emitted by the green LED or a blue light emitted by the blue LED and avoid using the complementary color, red, which would reduce the light-reflection rate. As described above, the present invention can raise the light-reflection rate due to the image light reflected by the reflection surface, and solve the light-detecting quantity reduction problem of the photodetector unit 60, or "color blindness" phenomenon, of the optical mouse. Further, other complementary color problems, such as, for example, yellow and purple, or blue and orange, can be resolved as well.

As shown in FIG. 4, the light source unit 30 also can be a LED with two different colors of light chips, so that the light-guiding unit 40 only needs one light-receiving surface 41 to face the light source unit 30. The light source unit 30 has an arcuate shape formed at a front end thereof. The light-guiding unit 40 and the lens unit 50 are integrally formed to each other, which are arranged in the accommodation space 11 of the housing 10, and the lens unit 50 is upwardly extended through the light hole 21 of the printed circuit board 20 to face the photodetector unit 60. Hence, the non-complementary color light can be provided to enable the computer system to recognize motion and speed of the optical mouse, thereby avoiding the "color blindness" phenomenon of the optical mouse.

There has thus been described a new, novel and heretofore unobvious optical mouse which eliminates the aforesaid problem in the prior art. Furthermore, those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An optical mouse, comprising:
    a housing having an accommodation space formed therein;
    a printed circuit board arranged in the accommodation space of the housing;
    a light source unit having different colors of image light sources, wherein the light source unit is disposed on the printed circuit board;
    a photodetector unit disposed on the printed circuit board, wherein the photodetector unit is opposite to the light sources;
    a light-guiding unit arranged in the accommodation space of the housing, wherein the light-guiding unit is adjacent to the light source unit for guiding a non-complementary color light relative to a reflection surface from one of the image light sources to the reflection surface, and the light-guiding unit further has a plurality of light receiving surfaces non-coplanarly connected to one another and in correspondence with the light sources, respectively; and
    a lens unit arranged in the accommodation space of the housing, wherein the lens unit is positioned below the photodetector unit for converging a reflected light reflected by the reflection surface into the photodetector unit.

2. The optical mouse of claim 1, wherein the light source unit includes a red LED, a green LED and a blue LED.

3. The optical mouse of claim 1, wherein the light source unit is a LED with at least two different colors of light chips.

4. The optical mouse of claim 1, wherein the printed circuit board has a light hole for allowing reflected light converged by the lens unit to pass therethrough, the light source unit and the photodetector unit are respectively arranged on two opposite sides of the light hole on the printed circuit board, and the light guiding unit is upwardly extended through the light hole to face the light source unit.

5. The optical mouse of claim 1, wherein the printed circuit board has a light hole, and the lens unit is upwardly extended through the light hole to face the photodetector unit.

6. The optical mouse of claim 1, wherein the lens unit has a coupling portion for coupling with an end of the light-guiding unit.

7. The optical mouse of claim 1, wherein the light source unit has an arcuate shape formed at a front end thereof.

8. The optical mouse of claim 1, wherein the light-guiding unit has at least one light-receiving surface and a light-exiting surface positioned at an opposite end of the light-receiving surface, and an area of the light-receiving surface of the light-guiding unit is larger than that of the light-exiting surface for enabling light to carry a brightest image formed on the reflection surface.

9. An optical mouse, comprising:
    a housing having an accommodation space formed therein;
    a printed circuit board arranged in the accommodation space of the housing;
    a light source unit having different colors of image light sources, wherein the light source unit is disposed on the printed circuit board;
    a photodetector unit disposed on the printed circuit board, wherein the photodetector unit is opposite to the light sources;

a light-guiding unit arranged in the accommodation space of the housing, wherein the light-guiding unit is adjacent to the light source unit for guiding a non-complementary color light relative to a reflection surface from one of the image light sources to the reflection surface, and the light-guiding unit further has at least one light-receiving surface and a light-exiting surface positioned at an opposite end of the light-receiving surface, and an area of the light-receiving surface of the light-guiding unit is larger than that of the light-exiting surface for enabling light to carry a brightest image formed on the reflection surface; and a lens unit arranged in the accommodation space of the housing, wherein the lens unit is positioned below the photodetector unit for converging a reflected light reflected by the reflection surface into the photodetector unit.

10. The optical mouse of claim 9, wherein the light source unit includes a red LED, a green LED and a blue LED.

11. The optical mouse of claim 9, wherein the light source unit is a LED with at least two different colors of light chips.

12. The optical mouse of claim 9, wherein the printed circuit board has a light hole for allowing reflected light converged by the lens unit to pass therethrough, the light source unit and the photodetector unit are respectively arranged on two opposite sides of the light hole on the printed circuit board, and the light guiding unit is upwardly extended through the light hole to face the light source unit.

13. The optical mouse of claim 9, wherein the printed circuit board has a light hole, and the lens unit is upwardly extended through the light hole to face the photodetector unit.

14. The optical mouse of claim 9, wherein the light-guiding unit has a plurality of light receiving surfaces non-coplanarly connected to one another and in correspondence with the light sources, respectively.

15. The optical mouse of claim 9, wherein the lens unit has a coupling portion for coupling with an end of the light-guiding unit.

16. The optical mouse of claim 9, wherein the light source unit has an arcuate shape formed at a front end thereof.

* * * * *